(12) United States Patent
Chen et al.

(10) Patent No.: US 7,119,396 B2
(45) Date of Patent: Oct. 10, 2006

(54) NROM DEVICE

(75) Inventors: Bomy Chen, Cupertino, CA (US); Dana Lee, Santa Clara, CA (US); Yaw Wen Hu, Cupertino, CA (US); Bing Yeh, Los Altos Hills, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 81 days.

(21) Appl. No.: 10/962,008

(22) Filed: Oct. 8, 2004

(65) Prior Publication Data

US 2006/0079053 A1 Apr. 13, 2006

(51) Int. Cl.
*H01L 29/792* (2006.01)
(52) U.S. Cl. .............................. 257/324; 257/E27.103
(58) Field of Classification Search ................. 257/324
See application file for complete search history.

(56) References Cited

U.S. PATENT DOCUMENTS

| 5,768,192 | A | 6/1998 | Eitan |
| 6,011,725 | A | 1/2000 | Eitan |
| 6,486,028 | B1 | 11/2002 | Chang et al. |
| 6,559,500 | B1 * | 5/2003 | Torii ........................ 257/324 |
| 6,773,994 | B1 | 8/2004 | Chittipeddi et al. |
| 6,853,587 | B1 * | 2/2005 | Forbes ............... 257/E27.103 |
| 2003/0235076 | A1 | 12/2003 | Forbes |

* cited by examiner

*Primary Examiner*—Chandra Chaudhari
(74) *Attorney, Agent, or Firm*—DLA Piper Rudnick Gray Cary US LLP

(57) ABSTRACT

A method of forming a memory device (and the resulting device) by forming an electron trapping dielectric material over a substrate, forming conductive material over the dielectric material, forming a spacer of material over the conductive material, removing portions of the dielectric material and the conductive material to form segments thereof disposed underneath the spacer of material, forming first and second spaced-apart regions in the substrate having a second conductivity type different from that of the substrate, with a channel region extending between the first and second regions, with the segments of the dielectric and first conductive materials being disposed over a first portion of the channel region for controlling a conductivity thereof, and forming a second conductive material over and insulated from a second portion of the channel region for controlling a conductivity thereof.

4 Claims, 4 Drawing Sheets

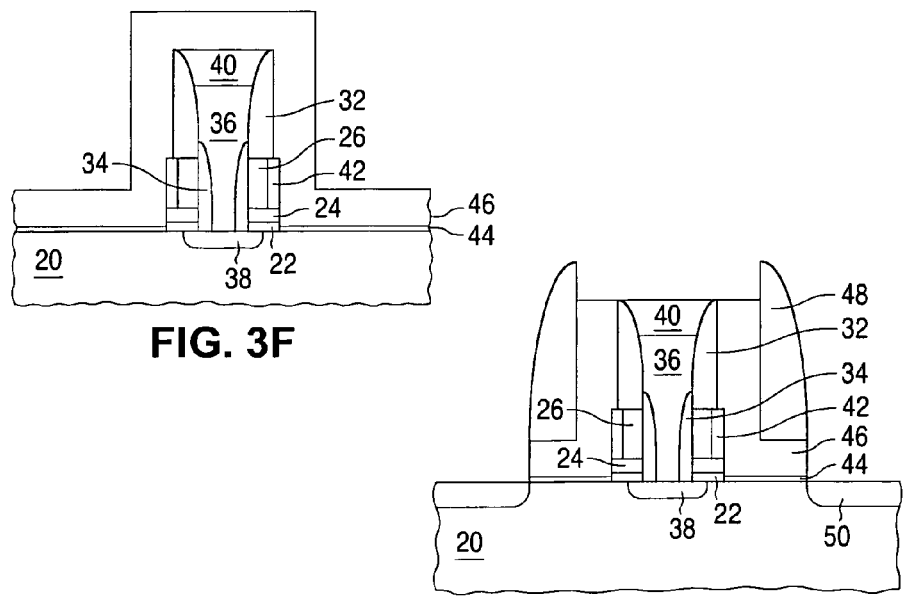
FIG. 3F
FIG. 3G
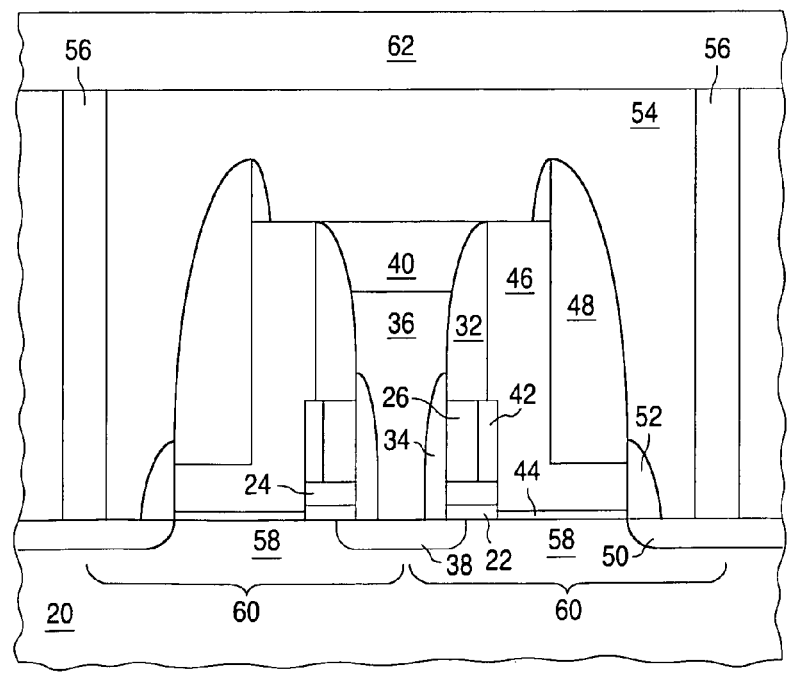
FIG. 3H

NROM DEVICE

FIELD OF THE INVENTION

The present invention relates to nonvolatile read-only memory (NROM) devices and more particularly to NROMs formed in a self aligned manner.

BACKGROUND OF THE INVENTION

An NROM device is a nonvolatile read-only memory electronic memory device which stores charges in a dielectric layer and is well-known in the art. Referring to FIG. 1, there is shown a cross-sectional view of an NROM device 1 of the prior art. The device 1 is made on a silicon substrate 2 with a first conductivity type, and with first and second regions 3/4 spaced apart from one another which are of a second conductivity type different from the first conductivity type of the silicon substrate 2. Separating the first region 3 from the second region 4 is a channel region 5. A first insulating layer 6 such as silicon oxide or silicon dioxide is formed over the channel region 5. A dielectric 7, such as silicon nitride, is positioned over the silicon dioxide layer 6. A second insulating layer 8 such as another layer of silicon dioxide is positioned over the dielectric 7. Collectively, the first insulating layer 6, the dielectric layer 7 and the second insulating layer 8 are also known as an ONO layer 6–8. Finally, a polysilicon gate 9 is positioned on the second layer silicon dioxide 8. Thus, the dielectric 7 is spaced apart and is insulated from the channel region 5 via the first insulating layer 6. The polysilicon gate 9 is insulated and separated from the dielectric 7 by the second insulating layer of silicon dioxide 8. In summary, the polysilicon gate 9 is spaced apart and separated from the channel region 5 by the ONO layer 6–8.

The NROM device 1 is a double density, nonvolatile storage cell, capable of storing 2 bits of information in the cell. The polysilicon layer 9 serves as the gate and controls the flow of current between the first region 3 and the second region 4 through the channel region 5. To program one of the bits, the polysilicon gate 9 is raised to a high positive voltage. The first region 3 is held at or near ground and the second region 4 is raised to a high positive voltage. Electrons from the first region 3 accelerate into the channel 5 towards the second region 4 and through hot channel electron injection mechanism are injected through the first oxide layer 6 and are trapped in the dielectric 7 near the region 10 of the dielectric layer 7. Since the dielectric layer 7, comprising of silicon nitride is a nonconductive material, the charges are trapped in the region 10.

To program the other bit of the cell 1, the polysilicon layer 9 is raised to a high positive voltage. The second region 4 is held at or near ground and the first region 3 is raised to a high positive voltage. Electrons from the second region 4 accelerate in the channel 5 towards the first region 3 and through hot channel electron injection mechanism are injected through the first silicon dioxide layer 6 and are trapped in the region 11 of the dielectric layer 7. Again, since the silicon nitride layer 7 is nonconductive, the charges are trapped in the region 11.

To read one of the bits, the first region 3 is held near ground. A positive bias voltage is applied to the polysilicon layer 9. The voltage applied is such that if the region 11 does not contain trapped charges (i.e. is not programmed), it will cause the channel region 5 underneath it to be conductive. However, if the region 11 has trapped charges (i.e. is programmed), the channel region 5 underneath will not be conductive (not be turned on). A positive voltage is also applied to the second region 4. The voltage applied to the second region 4 is such that it causes a depletion region of the second region 4 to expand and encroach the channel region 5 so that it extends beyond the region 10. Thus, the state of whether region 10 is programmed or not is irrelevant in reading region 11 of the memory cell. Therefore, under that condition, the state of conduction of the channel 5 between the first region 3 and the second region 4 is dependent solely on the state of charge stored or trapped in the region 11.

To read the other bit, the voltages applied are simply reversed. Thus, the second region 4 is held near ground. A positive bias voltage is applied to the polysilicon layer 9. The voltage applied is such that if region 10 is not programmed, it will cause the channel region 5 underneath it to be conductive. However, if region 10 is programmed, channel region 5 underneath will not be conductive (not be turned on). A positive voltage is also applied to the first region 3. The voltage applied to first region 3 is such that it causes the depletion region of the first region 3 to expand and encroach into the channel region 5 beyond region 11 so that the state of charge stored or trapped in region 11 is irrelevant in reading region 10 of the memory cell.

To erase, the substrate 2, the first region 3, and the second region 4, may be connected to a high positive voltage thereby causing electrons from the trapped regions 10 and 11 to tunnel via Fowler/Nordheim tunneling into the substrate 2.

The problem with the NROM cell 1 of the prior art is that the channel 5 is on the planar surface of the silicon substrate 2, and channel region 5 needs to be sufficiently large so that the two trapped regions 10 and 11 are sufficiently separated. This becomes a problem as the cell 1 is scaled to smaller sizes, especially since the thickness of the ONO layers 6–8 cannot be scaled.

FIG. 2 illustrates another prior art design of a NROM device which stores charges in a dielectric layer, with a split gate memory cell configuration. Here, oxide and nitride layers 6–7, along with a memory gate electrode 8, are disposed over only a first section of the channel region 5. Also, the polysilicon gate 9 has a lower portion that is disposed over and insulated from a second section of the channel region 5 (via insulation material 12), and a second portion that extends up and over oxide 6, nitride 7 and memory gate 8. Electrical contacts 13 and 14 are formed to make electrical contact with first and second regions 3/4. With this configuration, only a single bit of information is stored by programming nitride layer 7 with trapped electrons, in the same manner as described above. The problem with this design is that is can be difficult to scale down in size. Specifically, the effective channel length needs to be long enough to tolerate different lithographic steps used to form the separate poly gate 9 and oxide 6/nitride 7/gate 8. Further, the width of the oxide/nitride/gate 6/7/8 is at least one lithographic feature length long, which is unnecessarily long given that the trapped charges are immobile within the dielectric material.

There is a need for an improved method of forming an electron trapping NROM device that allows the device to scale down further in size than conventional designs allow.

SUMMARY OF THE INVENTION

The present invention solves the aforementioned problems by forming the memory gates with isolated nitride storage nodes defined by spacer dimensions smaller than a lithographic limitation.

The present invention is a method of forming a memory device on a substrate of a first conductivity type, including forming an electron trapping dielectric material over the substrate, forming a first conductive material over the dielectric material, forming a spacer of material over the first conductive material, removing portions of the dielectric material and the first conductive material to form segments of the dielectric and the first conductive materials disposed underneath the spacer of material, forming first and second spaced-apart regions in the substrate having a second conductivity type different from the first conductivity type wherein a channel region with first and second portions is defined in the substrate between the first and second regions and wherein the segments of the dielectric and first conductive materials are disposed over the channel region first portion for controlling a conductivity thereof, and forming a second conductive material over and insulated from the channel region second portion for controlling a conductivity thereof.

The present invention is also a method for forming a memory device on a substrate of a first conductivity type that includes forming a first layer of an electron trapping dielectric material over the substrate, forming a second layer of a conductive material over the first layer, forming a third layer of a material over the second layer, forming a trench in the third layer, forming spacers of material along sidewalls of the trench, forming a first region in the substrate this is disposed under the trench and has a second conductivity type different from the first conductivity type, removing portions of the third layer adjacent the trench, removing portions of the first and second layers to form segments of the first and second layers that are each disposed under one of the spacers of material, forming a fourth layer of a conductive material over and insulated from the substrate, forming a pair of second regions in the substrate having the second conductivity type, wherein a pair of channel regions are each defined in the substrate between the first region and one of the pair of second regions, and wherein each channel region includes a first portion and a second portion, wherein each of the first and second layer segments is disposed over one of the first portions for controlling a conductivity thereof, and wherein the fourth layer includes portions thereof each of which is disposed over and insulated from one of the channel region second portions for controlling a conductivity thereof.

In yet another aspect of the present invention, a method of forming a memory device on a substrate of a first conductivity type includes forming pairs of memory cells on the substrate, forming a plurality of first regions in the substrate, and forming a layer of second conductive material. Forming each of the memory cell pairs includes forming an electron trapping dielectric material over the substrate, forming a first conductive material over the dielectric material, forming a pair of spacers of material over the first conductive material, and removing portions of the dielectric material and the first conductive material to form segments of the dielectric and the first conductive materials each disposed underneath one of the spacers of material. The forming of the first regions includes forming a plurality of first regions in the substrate where each is disposed under one of the memory cell pairs and has a second conductivity type different from the first conductivity type, wherein a plurality of channel regions are defined in the substrate each extending between adjacent pairs of the first regions, and wherein each of the channel regions have first and second portions. The forming of the layer of second conductive material includes forming a layer of second conductive material that extends over the pairs of memory cells and that includes portions each of which extend over and are insulated from one of the channel region second portions for controlling a conductivity thereof. Each of the segments of the dielectric and first conductive materials are disposed over one of the channel region first portions for controlling a conductivity thereof.

In yet one more aspect of the present invention, a memory device includes pairs of memory cells formed on a substrate of a first conductivity type, a plurality of channel regions and a layer of second conductive material. Each of the memory cell pairs includes a pair of electron trapping dielectric material segments disposed over the substrate, a pair of first conductive material segments disposed over the dielectric material segments, a pair of spacers of material disposed over the first conductive material segments, and a first region formed in the substrate under the memory cell pair and having a second conductivity type different from the first conductivity type. The plurality of channel regions are defined in the substrate each extending between adjacent pairs of the first regions, wherein each of the channel regions have first and second portions, and wherein each of the segments of the dielectric and first conductive materials are disposed over one of the channel region first portions for controlling a conductivity thereof. The layer of second conductive material extends over the pairs of memory cells and includes portions each of which extend over and are insulated from one of the channel region second portions for controlling a conductivity thereof.

Other objects and features of the present invention will become apparent by a review of the specification, claims and appended figures.

BRIEF DESCRIPTION OF THE DRAWINGS

FIG. 3A to 3H are cross-sectional side views of one of the active regions showing in sequence the process for forming a non volatile memory array of electron trapping memory cells of the present invention.

DETAILED DESCRIPTION OF THE PREFERRED EMBODIMENTS

The present invention is a method of forming an NROM device in a self aligned manner. With the present invention, the dimensions of the memory cell components can be more easily and reliably scaled down to smaller dimensions.

FIGS. 3A to 3H illustrate the formation of the memory cells of the present invention. These figures illustrate cross section views of one portion of one of the active regions, which are formed in-between isolation regions. The formation of isolation regions (via LOCOS, STI, etc.) interleaved among active regions is well known in the art and not further discussed herein. The following figures illustrate the formation of a single pair of memory cells, wherein the process in fact produces many such memory cell pairs in each of the active regions.

Figure 1:
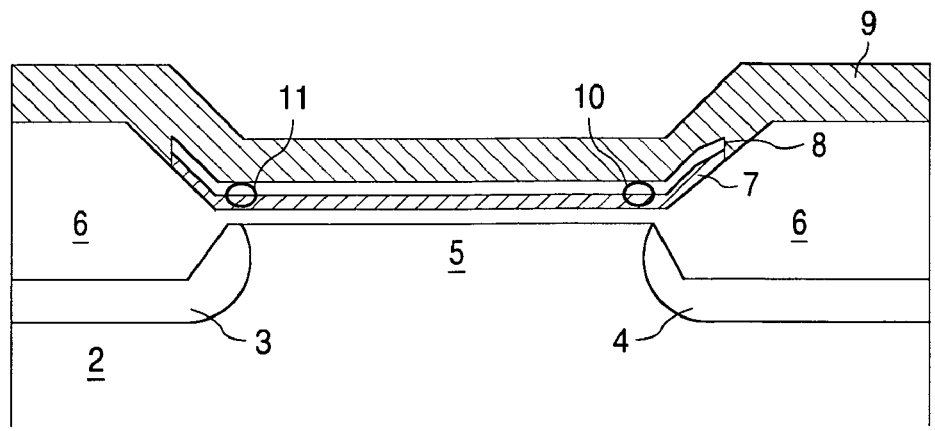
FIG. 1 is a cross-sectional side view of a conventional memory cell.
Figure 2:
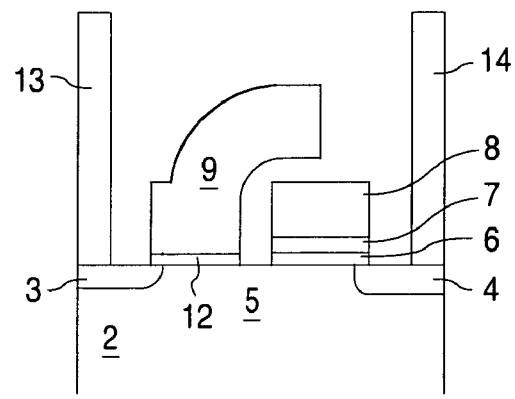
FIG. 2 is a cross-sectional side view of another conventional memory cell.
Figure 3A:
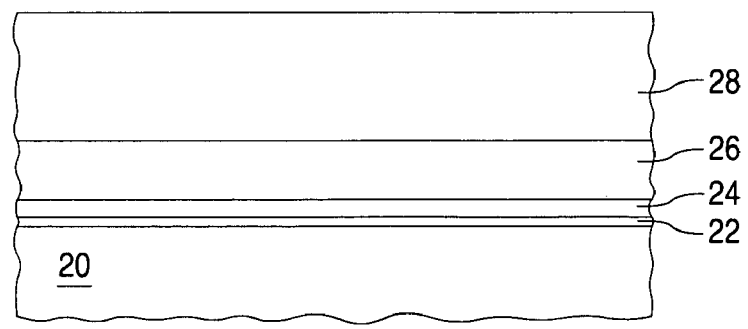

Referring to FIG. 3A, a layer of insulation material is formed on the substrate 10 by well known techniques such as oxidation or deposition (e.g. chemical vapor deposition or CVD), forming a layer of silicon dioxide (oxide) preferably 2–8 nm thick. A layer of dielectric material 24, such as silicon nitride (nitride), is formed over the oxide layer 22 preferably by CVD (e.g. 3–12 nm thick). A layer of polysilicon 26 (hereinafter "poly") is deposited over the nitride layer 24 (e.g. 10–20 nm thick), by a well known process such as Low Pressure CVD or LPCVD. A sacrificial layer of material 28, preferably nitride, is formed over poly layer 26, again preferably by CVD (e.g. 20–40 nm thick). It should be well understood that all of the parameters described herein depend upon the design rules and the process technology generation, and one skilled in the art would understand that the present invention is not limited to any specific process technology generation, nor to any specific value in any of the process parameters described herein. The resulting structure is shown in FIG. 3A.

Figure 3B:
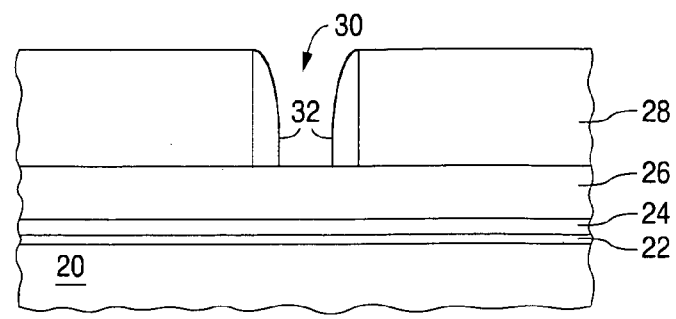

A trench 30 is formed into the nitride layer 28, preferably using a conventional photo-lithography process (e.g. form mask layer over portions of nitride 28, and performing an anisotropic nitride etch to remove exposed portions of nitride 28). The width of trench 30 can be as small as the smallest possible lithographic feature for the process used. Trench 30 extends down to and exposes poly layer 26. Next, first spacers 32 are formed along the sidewalls of the trench 30. The formation of spacers is well known in the art, and includes depositing a material over the contour of a structure, followed by an anisotropic etch process (e.g. reactive ion etch—RIE), whereby the material is removed from horizontal surfaces of the structure, while the material remains largely intact on vertically oriented surfaces of the structure (and resulting in rounded upper surfaces extending away from the vertical oriented surfaces). To form first spacers 32, a thick layer of oxide is deposited over the structure, followed by an anisotropic oxide etch, which removes the deposited oxide except for first spacers 32 inside trenches 30. The resulting structure is shown in FIG. 3B.

Figure 3C:
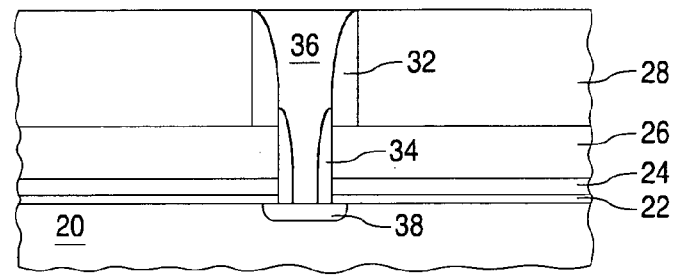

Anisotropic poly, nitride and oxide etches follow, to remove exposed portions of poly layer 26, nitride layer 24 and oxide layer 22, for extending trench 30 down to and exposing substrate 20. By etching between spacers 32, the lower portion of trench 30 has a width less than that of the upper portion of the trench 30). Second spacers 34 are next formed in the lower portion of trench 30 by oxide deposition and anisotropic etch, further narrowing the lower portion of trench 30. The trench 30 is then filled with a block of polysilicon 36 by depositing a thick poly layer over the structure, followed by a planarizing poly etch (e.g. CMP- Chemical Mechanical Polish) that uses nitride 28 as an etch stop. Suitable ion implantation is then made across the entire surface of the structure, where the ions form a first region (i.e. source region) 38 in the exposed portion of substrate 20 at the bottom of trench 30. It should be noted that some or all of this ion implantation can occur before the formation of second spacers 34, depending upon the desired width of the source region 38. The resulting structure is shown in FIG. 3C.

Figure 3D:
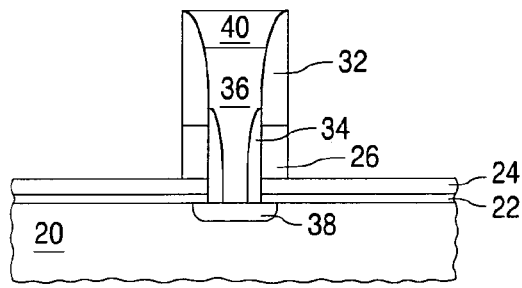
Figure 3E:
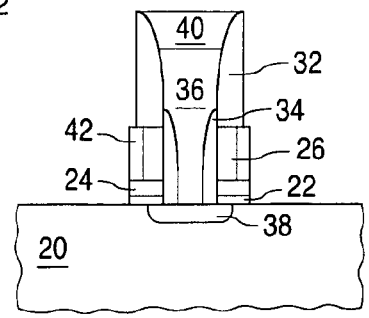

A protective oxide layer 40 is next formed on the top exposed portion of poly block 36. Oxide layer 40 is preferably formed via thermal oxidation or by TEOS (tetra-ethyl-ortho-silicate) deposition. A nitride etch follows, which removes nitride layer 28. An anisotropic poly etch is used to remove exposed portions of poly layer 26, leaving only segments of poly layer 26 directly under first spacers 32, as shown in FIG. 3D. Thermal oxidation is then used to form a layer of oxide 42 on the exposed (side) portions of poly layer 26. Anisotropic nitride and oxide etches are performed to remove exposed portions of nitride layer 24 and oxide layer 22, leaving separate segments of these layers under spacers 32, where the width of these segments are defined by the width of the spacers 32. The resulting structure is shown in FIG. 3E.

A thin insulation layer 44 is next formed on the exposed portions of substrate 20, preferably made of oxide formed by thermal oxidation. A poly layer 46 is then formed over the structure, as illustrated in FIG. 3F. Nitride spacers 48 are then formed along the vertical portions of poly layer 44 by nitride deposition and anisotropic etch. An anisotropic poly etch is then used to remove those portions of poly layer 44 not protected by nitride spacers 48. Suitable ion implantation is used (with any appropriate blocking masks) to form second regions (i.e. drain regions) 44 in the exposed portions of the substrate 20. The resulting structure is shown in FIG. 3G.

Additional nitride spacers 52 are formed with a nitride deposition and etch process, for sealing and protecting the exposed ends of the poly layer 46. Passivation or other insulating material, such as BPSG 54, is used to cover the structure. A masking step is performed to define etching areas over the second (drain) regions 50. The BPSG 54 is selectively etched in the etching areas to create contact openings that extend down to second (drain) regions 50. The contact openings are then filled with conductor metal contacts 56 by metal deposition and planarizing etch-back. The final memory cell structure is shown in FIG. 3H. It should be noted that other processing steps can be intermixed in the above process for forming other memory devices, well implant areas and/or peripheral devices on the same substrate.

As shown in FIG. 3H, the process of the present invention forms pairs of memory cells 60 that mirror each other, with first and second regions 38/50 forming the source and drain for each cell (those skilled in the art know that source and drain can be switched during operation). Each pair of memory cells shares a single source region 38. The channel region 58 for each cell is the portion of the substrate that is in-between the source and drain 38/50. For each memory cell 60, poly layer 46 constitutes the control gate, poly layer segment 26 constitutes the memory gate, and nitride layer segment 24 serves as the charge trapping dielectric material. Control gate 46 is disposed over a first portion of the channel region 58 (insulated therefrom by oxide 44), and charge trapping dielectric 24 is disposed over a second portion of the channel region 58. Memory gate 26 is disposed over charge trapping dielectric 24. A common contact 62 line can be formed to connect all the metal contacts 56 in the active region together. Poly block 36, memory gates 26 and control gates 46 preferably extend through all the isolation and active regions forming lines that connect together like components from other pairs of memory cells in other active regions. Thus, any given memory cell in the array can be selected by the appropriate combination of the contact line (62), memory gate line (26), source line (36) and control gate line (46).

The operation of the memory cell 60 is now described. To program the memory cell, the memory gate 26 is raised to a positive voltage (e.g. 4–10V), the control gate 46 is raised to a positive voltage (e.g. 1–3V), the drain region 50 is held at or near ground potential and the source region 38 is raised to a positive voltage (e.g. 4–8V). Electrons from the drain region 50 accelerate into the channel region 58 towards the source region 38, and through hot channel electron injection are injected through the oxide layer 22 and are trapped in charge trapping dielectric 24.

To read the memory cell 60, the drain region 50 is held near ground potential. Voltages are applied to memory gate 26 (e.g. −5 to +5V), control gate 46 (e.g. 2–4V) and source groin 38 (e.g. 1–3V). The positive voltage on the control gate 46 will turn on (make conductive) that portion of the channel region 58 under the control gate 46. The voltage applied to the memory gate 26 is such that if charge trapping dielectric 24 does not contain trapped electron charges (i.e. is not programmed), it will cause the portion of channel region 58 underneath it to be turned on (i.e. conductive) as well. With both portions of the channel region conductive, electrical current will flow across the channel region 58, indicating an unprogrammed state (e.g. a "0" state). However, if charge trapping dielectric 24 does contain trapped electron charges (i.e. is programmed), the portion of channel region 58 underneath will not be turned on (i.e. not conductive). With part of the channel region turned off, little or no electrical current will flow across the channel region, indicating a programmed state (e.g. a "1" state). It should be noted that channel conductivity may be detected by switching the above described drain and source potentials, so that current flows is in the opposite direction.

To erase the memory cell from a programmed state, the substrate 20 and source 38 may be connected to a high positive voltage thereby injecting holes from the substrate into the charge trapping dielectric 24 to neutralize the trapped electrons. Alternately, either the memory gate 26 or control gate 46 can be raised to a high voltage to inject the holes into the charge trapping dielectric 24.

The design and process of the present invention has many advantages. The memory cells are made using a single photo-lithographic step. This means that the memory cell components are all self aligned to each other, thus allowing better scaling to small geometries and eliminating alignment tolerance issues for multiple photo-lithography steps. The dimensions of key memory cell components are more controllable and can be smaller than the single feature resolution of the photo-lithographic step. For example, spacers 32 are used to define the width of memory gate 26 and the charge trapping dielectric 24. Likewise, the deposition thickness of poly 46 and spacers 48 are used to define the width of control gate 46 over channel region 58. Thus, the overall memory cell size is reduced, and component sizes can be better and more uniformly controlled. Improved hot electron injection is achieved by having the electrons pass the gap between the control gate 46 and the memory gate 26, which accelerates the electrons even faster for better injection efficiency and faster speed.

Figure 4:
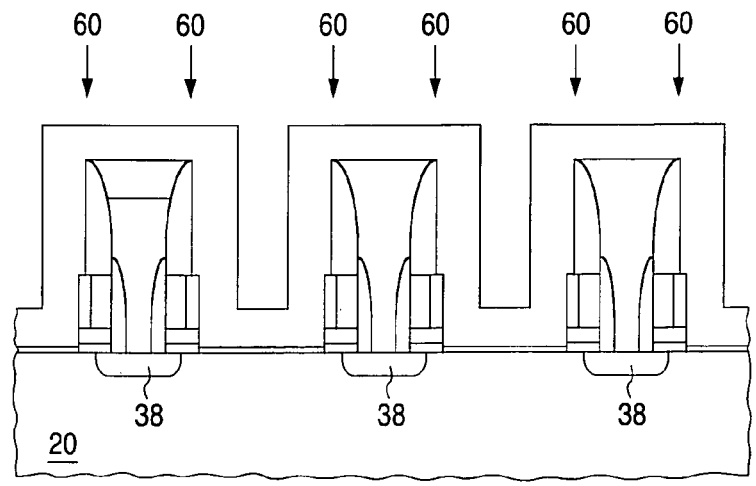
FIG. 4 is a cross-sectional side view of an alternative embodiment of the electron trapping memory cells of the present invention.

FIG. 4 illustrates an alternate embodiment of the present invention, which is a bidirectional version of the self aligned memory cell described above. The present embodiment includes the same structure shown in FIG. 3F, except that the poly layer 46 is selectively removed from the isolation regions separating the active regions (preferably using a masking/etch process), leaving strips of poly 46 each extending along the length of one of the active regions. This configuration operates in a similar manner to that described above, except that the source (first) region 38 from one pair of memory cells is operationally used as the drain (second) region for the adjacent pairs of memory cells, and vice versa.

Figure 5:
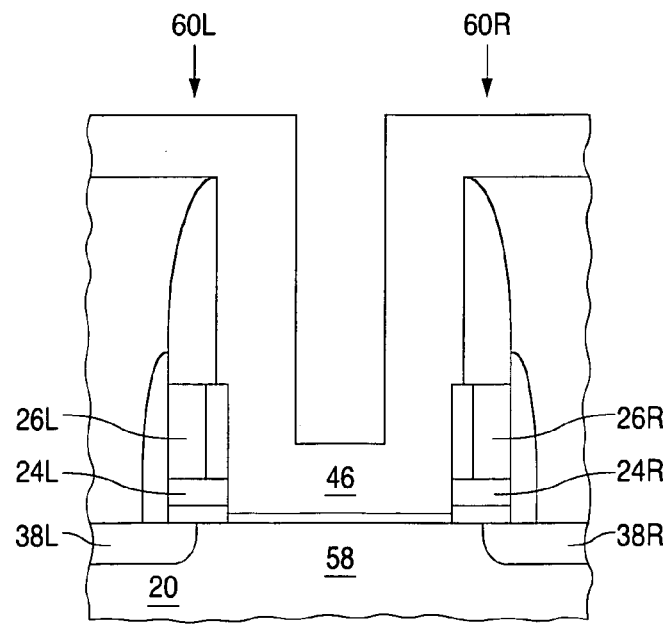
FIG. 5 is an enlarged cross-sectional side view of the alternative embodiment of the electron trapping memory cells of the present invention.

More specifically, the operation is best illustrated with reference to FIG. 5, which shows two adjacent memory cells (left hand memory cell 60L and right hand memory cell 60R) from adjacent pairs of memory cells 60. To program the right hand memory cell 60R, the memory gate 26R is raised to a positive voltage (e.g. 4–8V), the control gate 46 is raised to a positive voltage (e.g. 1–3V), the source region 38L is held at or near ground potential and the source region 38R is raised to a positive voltage (e.g. 2–5V). Electrons from the source region 38L accelerate into the channel region 58 towards the source region 38R and through hot channel electron injection are injected through the oxide layer 22 and are trapped in the charge trapping dielectric 24R. To program the left hand memory cell 60L, the left and right voltages above are reversed.

To read the right hand memory cell 60R, the source region 38R is held near ground. Positive voltages are applied to memory gate 26R (e.g. −3 to 0V) and to control gate 46 (e.g. 1–4V). A positive voltage is applied to the source region 38L such that it causes a depletion region of the source region 38L to expand and encroach the channel region 58 so that it extends beyond charge trapping dielectric 24L. A positive voltage (e.g. 0–3V) may be applied to the memory gate 26L to enhance the depletion region formation around region 38L. Thus, the state of whether charge trapping dielectric 24L is programmed or not is irrelevant in reading memory cell 60R. The positive voltage on the control gate 46 will turn on (make conductive) that portion of the channel region 58 under the control gate 46. The voltage applied to the memory gate 26R is such that if charge trapping dielectric 24R does not contain trapped electron charges (i.e. is not programmed), it will cause the portion of channel region 58 underneath it to be turned on (i.e. conductive) as well. With both portions of the channel region conductive, electrical current will flow across the channel region 58, indicating an unprogrammed state (e.g. a "0" state). However, if charge trapping dielectric 24R does contain trapped electron charges (i.e. is programmed), the portion of channel region 58 underneath will not be turned on (i.e. not conductive). With part of the channel region turned off, little or no electrical current will flow across the channel region, indicating a programmed state (e.g. a "1" state). To read the left hand memory cell 60L, the left and right voltages above are reversed.

To erase the memory cells from a programmed state, the substrate 20 and source(s) 38R and/or 38L may be connected to a high positive voltage thereby injecting holes from the substrate into the charge trapping dielectrics 24R and/or 24L to neutralize the trapped electrons. Alternately, either the memory gates 26R and 26L or control gate 46 can be raised to a high voltage to inject the holes into the charge trapping dielectrics 24R and/or 24L.

It should be noted that, as used herein, the terms "over" and "on" and "under" inclusively include "directly on" or "directly under" (no intermediate materials, elements or space disposed therebetween) and "indirectly on" or "indirectly under" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed therebetween). For example, forming an element "over a substrate" can include forming the element directly on the substrate with no intermediate materials/elements therebetween, as well as forming the element indirectly on the substrate with one or more intermediate materials/elements therebetween.

It is to be understood that the present invention is not limited to the embodiment(s) described above and illustrated herein, but encompasses any and all variations falling within the scope of the appended claims. For example, materials, processes and numerical examples described above are exemplary only, and should not be deemed to limit the claims. Further, as is apparent from the claims and specification, not all method steps need be performed in the exact order illustrated or claimed, but rather in any order that allows the proper formation of the NROM memory cell of the present invention. Lastly, single layers of material could be formed as multiple layers of such or similar materials, and vice versa.

What is claimed is:

1. A memory device comprising:

pairs of memory cells formed on a substrate of a first conductivity type, each of the memory cell pairs including:

a pair of electron trapping dielectric material segments disposed over the substrate, a pair of first conductive material segments disposed over the dielectric material segments, a pair of spacers of material disposed over the first conductive material segments, and a first region formed in the substrate under the memory cell pair and having a second conductivity type different from the first conductivity type;

a plurality of channel regions defined in the substrate each extending between adjacent pairs of the first regions, wherein each of the channel regions have first and second portions, and wherein each of the segments of the dielectric and first conductive materials are disposed over one of the channel region first portions for controlling a conductivity thereof;

a layer of second conductive material that extends over the pairs of memory cells and that includes portions each of which extend over and are insulated from one of the channel region second portions for controlling a conductivity thereof.

2. The device of claim 1, further comprising:

insulating material between the dielectric material segments and the substrate.

3. The device of claim 1, wherein each of the pairs of memory cells further includes:

a trench disposed between the pair of the electron trapping dielectric material segments and between the pair of the first conductive material segments; and a block of conductive material disposed in the trench and in electrical contact with the first region.

4. The device of claim 3, wherein each of the pairs of memory cells further comprises:

a pair of second spacers of material formed along the sidewalls of the trench and laterally adjacent to the segments of the conductive and the dielectric materials.

* * * * *